United States Patent
Muto

(10) Patent No.: US 11,105,016 B2
(45) Date of Patent: Aug. 31, 2021

(54) CRYSTAL GROWTH APPARATUS WITH CONTROLLED CENTER POSITION OF HEATING

(71) Applicant: SHOWA DENKO K.K., Tokyo (JP)

(72) Inventor: Daisuke Muto, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 33 days.

(21) Appl. No.: 16/519,242

(22) Filed: Jul. 23, 2019

(65) Prior Publication Data
US 2020/0032414 A1 Jan. 30, 2020

(30) Foreign Application Priority Data

Jul. 25, 2018 (JP) .............................. JP2018-139437

(51) Int. Cl.
| | |
|---|---|
| *C30B 35/00* | (2006.01) |
| *C30B 23/06* | (2006.01) |
| *C23C 14/24* | (2006.01) |
| *C23C 14/06* | (2006.01) |
| *C30B 29/36* | (2006.01) |

(52) U.S. Cl.
CPC ........ *C30B 23/066* (2013.01); *C23C 14/0635* (2013.01); *C23C 14/243* (2013.01); *C30B 29/36* (2013.01)

(58) Field of Classification Search
CPC ....... C30B 23/00; C30B 23/002; C30B 23/02; C30B 23/06; C30B 23/063; C30B 23/066; C30B 29/00; C30B 29/10; C30B 29/36; C30B 35/00; C30B 35/002; C23C 14/0635; C23C 14/243

USPC .... 117/84–86, 105, 107, 200–202, 204, 937, 117/951
See application file for complete search history.

(56) References Cited

U.S. PATENT DOCUMENTS

| | | | | |
|---|---|---|---|---|
| 4,936,949 | A * | 6/1990 | Kida | ........................ C30B 15/12 117/213 |
| 2007/0227189 | A1* | 10/2007 | Sakai | ...................... C30B 29/06 65/83 |
| 2007/0283882 | A1* | 12/2007 | Cho | ........................ C30B 29/06 117/204 |

(Continued)

FOREIGN PATENT DOCUMENTS

| | | |
|---|---|---|
| CN | 101089233 A | 12/2007 |
| CN | 101440518 A | 5/2009 |
| CN | 102257188 A | 11/2011 |

(Continued)

OTHER PUBLICATIONS

Communication dated Dec. 24, 2020, from the China National Intellectual Property Administration in application No. 201910665852.5.

*Primary Examiner* — Kenneth A Bratland, Jr.
(74) *Attorney, Agent, or Firm* — Sughrue Mion, PLLC

(57) ABSTRACT

A crystal growth apparatus, comprising a crucible, a heat-insulating material which covers a circumference of the crucible, and a heating member which is located on the outside of the heat-insulating material and is configured to perform induction heating of the crucible, wherein the heat-insulating material has a movable part, wherein the movable part forms an opening in the heat-insulating material by the movement of the movable part to control an opening ratio of the opening in the heat-insulating material.

13 Claims, 5 Drawing Sheets

(56) References Cited

U.S. PATENT DOCUMENTS

2009/0158995 A1* 6/2009 Lew .................. C30B 11/002
  117/200
2013/0269598 A1* 10/2013 Chen .................. C30B 23/002
  117/86

FOREIGN PATENT DOCUMENTS

| | | | |
|---|---|---|---|
| CN | 102644105 | A | 8/2012 |
| CN | 104195640 | A | 12/2014 |
| CN | 105705682 | A | 6/2016 |
| CN | 207109138 | U | 3/2018 |
| CN | 108070908 | A | 5/2018 |
| JP | 8-40798 | A | 2/1996 |
| JP | 2014-012640 | A | 1/2014 |
| JP | 2014234331 | A * | 12/2014 |
| JP | 2016-117624 | A | 6/2016 |
| JP | 2017-154926 | A | 9/2017 |
| TW | 200928018 | A | 7/2009 |
| TW | 201317408 | A | 5/2013 |
| WO | 2012/079439 | A1 | 6/2012 |

\* cited by examiner

CRYSTAL GROWTH APPARATUS WITH CONTROLLED CENTER POSITION OF HEATING

BACKGROUND OF THE INVENTION

Field of the Invention

The present invention relates to a crystal growth apparatus.

Priority is claimed on Japanese Patent Application No. 2018-139437, filed on Jul. 25, 2018, the content of which is incorporated herein by reference.

Description of Related Art

Silicon carbide (SiC) has a breakdown electric field larger by one digit than and the band gap three times larger than those of silicon (Si). Moreover, silicon carbide (SiC) has characteristics such as thermal conductivity which is about three times higher than silicon (Si). Therefore, silicon carbide (SiC) is expected to be applied to power devices, high frequency devices, high temperature operation devices and the like. For such semiconductor devices, a SiC epitaxial wafer has been used recently.

A SiC epitaxial wafer is produced by growing a SiC epitaxial film that acts as an active region of a SiC semiconductor device on a SiC single crystal substrate by chemical vapor deposition (CVD) method.

SiC single crystal substrates are manufactured by cutting a SiC single crystal. The SiC single crystal can usually be obtained by a sublimation method. The sublimation method is a method wherein a seed crystal made of the SiC single crystal is placed on a base disposed in a crucible made of graphite, and the sublimation gas sublimated from raw material powder in the crucible is supplied to the seed crystal by heating the crucible, and the seed crystal is grown to a larger SiC single crystal.

In recent years, increase in diameter of the SiC single crystal substrate on which a SiC epitaxial film is grown is expected in response to market demands. Consequently, the SiC single crystal itself is also expected to have the larger diameter and the longer length. Additionally, the higher quality of the SiC single crystal is also increasingly demanded as well as the larger diameter and the longer length. There are various factors that affect the quality of the SiC single crystal in crystal growth of the SiC single crystal.

A shape of the SiC single crystal and temperature condition while the SiC single crystal is crystal-growing are factors which influence the quality of the SiC single crystal.

Patent Document 1 states a method for controlling a shape of the SiC single crystal by providing a heat-insulating material at a predetermined position. Patent Document 2 states that the temperature distribution in a furnace can be controlled by placing a heat-insulating material in a closed space which is separated from raw material gas.

CITATION LIST

Patent Documents

Patent Document 1: Japanese Unexamined Patent Application, First Publication No. 2014-012640
Patent Document 2: Japanese Unexamined Patent Application, First Publication No. 2016-117624

SUMMARY OF THE INVENTION

Problems to be Solved by the Invention

However, in the methods described in Patent Documents 1 and 2, the temperature distribution and the center position of heating in the furnace cannot be changed after the position and the amount of a heat-insulating material are determined. That is, the controllability of the temperature distribution in the furnace was not sufficient.

The present invention is made based on the problems described above, and an object of the present invention is to provide a crystal growth apparatus which can control the center position of heating.

Means for Solving the Problems

As a result of intensive studies, the inventors of the present invention have found that, by providing an opening in a heat-insulating material and controlling the opening ratio of the opening, a center position of heating in the furnace can be controlled. That is, the present invention provides a following means to solve the aforementioned problems.

(1) A crystal growth apparatus according to a first aspect includes a crucible, a heat-insulating material which covers a circumference of the crucible, and a heating member which is located on the outside of the heat-insulating material and is configured to perform induction heating of the crucible, wherein the heat-insulating material has a movable part, wherein the movable part forms an opening in the heat-insulating material by the movement of the movable part to control an opening ratio of the opening of the heat-insulating material.

The apparatus according to the aspect preferably has the following features. Two or more of the following features can be preferably combined.

(2) In the crystal growth apparatus according to the above aspect, the movable part may move symmetrically with the crucible as a center, when the apparatus is observed in planar view from a vertical direction of a supporting surface by which the crucible is supported.

(3) In the crystal growth apparatus according to the above aspect, the movable part may be located below the crucible.

(4) The crystal growth apparatus according to the above aspect may have a configuration wherein the movable part has a first inclined surface which is inclined relative to an operating direction of the movable part, and the opening ratio is controlled by the distance between the first inclined surface and a second inclined surface which faces the movable part of the heat-insulating material.

Effects of the Invention

According to the crystal growth apparatus according to the aspect, it is possible to control a center position of heating in the furnace easily.

DETAILED DESCRIPTION OF THE INVENTION

Hereinafter, SiC single crystal growth apparatus of the present embodiment and method of growing SiC single crystal will be appropriately described below in detail with reference to drawings. The drawings used in the following description may include dimensions or ratios, which have been enlarged differently from actual components for better understanding of features of the present invention or for the sake of convenience. The materials, dimensions, and the like, provided in the following description, are merely exemplary examples and the present invention is not limited thereto. Those parameters can be appropriately tailored within the range not departing the gist of the present invention. Unless otherwise specified, the number, size, position, material, ratio, shape, and the like may be changed, added or omitted as necessary.

(Crystal Growth Apparatus)

Figure 1:
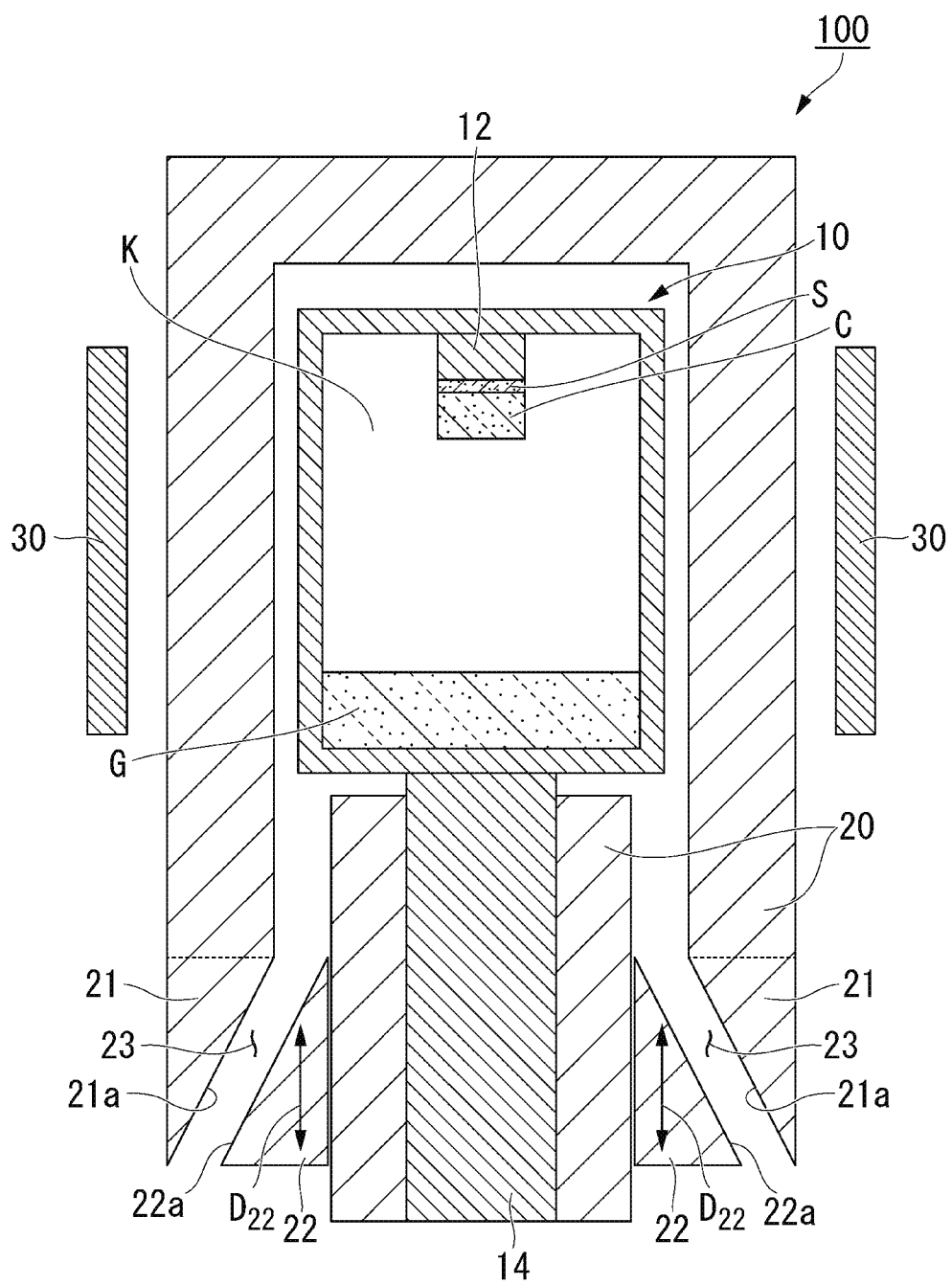
FIG. 1 shows a schematic cross-sectional view showing a preferred example of a crystal growth apparatus according to the first embodiment.

FIG. 1 is a schematic cross-sectional view showing an example of a crystal growth apparatus according to the first embodiment. The crystal growth apparatus 100 shown in FIG. 1 includes a crucible 10, a heat-insulating material 20, and a heating member 30. The crucible 10 is supported by a support member 14. In FIG. 1, a raw material G, a seed crystal S, and a single crystal C which is crystal-grown on the seed crystal S are illustrated simultaneously for better understanding.

In the drawings, a direction which is vertical to a supporting surface at which the crucible 10 is supported by the support member 14 is defined as a vertical direction (up-and-down direction), and a direction perpendicular to the vertical direction is defined as a radial direction. FIG. 1 is a cross sectional view wherein the apparatus is cut along the center axis of the support member 14 at an optional cross section.

The crucible 10 encloses a film formation space K in which the single crystal C grows. A well-known crucible can be used as the crucible 10 as long as it is a crucible which can produce the single crystal C by a sublimation method. For example, graphite, tantalum carbide or the like can be used as a material of a crucible. The crucible 10 is hot during growth, and therefore the crucible is formed of a material which can resist high temperature. For example, graphite has a very high melting point of 3550° C., and thus is durable to the high temperature during growth.

The raw material G is filled at the lower surface in the crucible 10 when the crystal growth is performed. The crystal installation part 12 is provided at a position facing the raw material G in the crucible 10. The single crystal C is grown by recrystallization of the raw material gas, which is sublimated from the raw material G, on a surface of the seed crystal S which is provided on the crystal installation part 12. The raw material gas can be efficiently supplied to the seed crystal S and the single crystal C since the crystal installation part 12 is located at a position facing the raw material G.

The heat-insulating material 20 covers a circumference of the crucible 10. In example shown in FIG. 1, the heat-insulating material 20 does not contact with the crucible 10. Due to the heat-insulating material 20, a temperature of the crucible 10 can be maintained. Although the heat-insulating material 20 can be made of a material which can be optionally selected, it is preferable that the heat-insulating material 20 is made of a material having thermal conductivity of 40 W/mk or less at high temperature of 2000° C. or more. Examples of the material having thermal conductivity of 40 W/mk or less at high temperature of 2000° C. or more include a graphite member or the like having thermal conductivity of 120 W/mk or less at normal temperature. Moreover, it is more preferable that the heat-insulating material 20 is made of a material having thermal conductivity of 5 W/mk or less at high temperature 2000° C. or more. Examples of the material having thermal conductivity of 5 W/mk or less at high temperature 2000° C. or more include a felt material containing graphite and/or carbon as a main material.

The heat-insulating material 20 has a movable part 22. The movable part 22 is a part of the heat-insulating material 20, and a movable element. The operating direction $D_{22}$ of the movable part 22 shown in FIG. 1 is a vertical direction. When the movable part 22 is shut, the circumference of the crucible 10 may be completely surrounded by the heat-insulating material 20. The movable part 22 can form an opening by transfer thereof. The opening is openable and closable due to the transfer of the movable part 22, and a cross-sectional area of the opening can be controlled by the transfer. The movable part 22 can provide an opening which is openable and closable, and may be configured to move in an optionally selected direction, for example, in a vertical direction, a horizontal direction, or an oblique direction. When another member such as a support member connects with the crucible 10, the heat-insulating material 20 may connect with or contact with at least a part of another member. The movable part 22 may be configured such that, when the movable part 22 is shut, the crucible 10 is enclosed in in a space which is surrounded by the heat-insulating material 20 and the aforementioned another member. Among the heat-insulating material 20, other parts of the heat-insulating material other than the movable part 22 may be considered to be an immovable part.

The movable part 22 shown in FIG. 1 is an annular member which surrounds a support member 14 in plan view, and an outer diameter of the movable part increases from an upper end to a lower end thereof. An inner diameter of the movable part 22 does not change. An upper surface of the movable part 22 is an inclined surface 22a which is inclined to the operating direction $D_{22}$. The inclined surface which is inclined to the operating direction means that the inclined surface is neither parallel to nor vertical to the operating direction. Here, the movable part 22 has a cross-sectional shape which is triangular or almost triangular, but not limited thereto. The bottom surface of the movable part 22 is flat, but not limited thereto.

An opposed part 21 of the heat-insulating material 20, which faces the movable part 22, has an annular shape, and has an inner diameter which increases from an upper end to a lower end. That is, the width of the cross section of the opposed part 21 decreases from the upper end to the lower end of the part. An outer diameter of the opposed part 21 may be changed or may not be changed. The lower surface of the opposed part 21 is a second inclined surface 21a which is inclined to the operating direction $D_{22}$ of the movable part 22. The second inclined surface 21a faces the inclined surface 22a, and is inclined to the operating direction $D_{22}$ to have the same inclination angle as that of the inclined surface 22a.

A driving member (not shown) which moves the movable part 22 to the operating direction $D_{22}$ is connected to the movable part 22. The driving member is not limited in so far as the driving member can move the movable part 22 to the vertical direction. For example, a lift-type driving member or the like may be provided by which the heat-insulating material is supported from a lower portion of the movable part 22.

When the movable part 22 transfers to the upper side and the inclined surface 22a contacts with the second inclined surface 21a, the entire circumference of the crucible is covered by the heat-insulating material 20. On the other hand, when the movable part 22 transfers toward the lower side, an opening 23 is formed between the inclined surface 22a and the second inclined surface 21a. The opening 23 acts as a heat transfer path. When heat escapes from the opening 23, the temperature in the vicinity of the opening 23 decreases. The crystal growth apparatus 100 shown in FIG. 1 has the opening 23 which is formed below the crucible 10. When the temperature in the vicinity of the opening 23 decreases, the center position of heating in the vertical direction of the crucible 10 relatively transfers to the upper side. The opening 23 may be positioned below the crucible 10 or diagonally below the crucible 10. That is, the opening 23 may be provided at a position where a part of or all of the opening 23 does not overlap with the crucible 10, or at a position where a part of or all of the opening 23 overlaps with the crucible 10 in plan view.

An opening ratio of the opening 23 can be controlled by a distance between the inclined surface 22a and the second inclined surface 21a. In the crystal growth apparatus 100 shown in FIG. 1, the center position of heating in the vertical direction of the crucible 10 transfers to the upper side as the opening ratio of the opening 23 increases. The opening ratio of the opening 23 can be optionally selected. The opening ratio may be considered such that the opening ratio is 0% when the opening is completely closed, and the opening ratio is 100% when the opening degree become the largest according to the opening. The opening ratio can be controlled as required in a range of 0% to 100%.

The movable part 22 is configured to move symmetrically with the crucible 10 as a center. The opening 23 is formed by the inclined surface 22a and the second inclined surface 21a. When the movable part 22 is operated symmetrically around the crucible 10 as a center, the opening 23 is formed at the position which is symmetrically around the crucible 10 as a center, when the opening 23 is observed from above in plan view. When the opening 23 is formed symmetrically in plan view, the temperature difference in a radial direction of the crucible 10 can be reduced.

A heating member 30 is located on the outside of the heat-insulating material 20. The heating member 30 shown in FIG. 1 is located on the outside of the heat-insulating material 20 in the radial direction. For example, a coil or the like which is wound around a periphery of the crucible 10 can be used as the heating member 30. When a current is supplied to the coil, a magnetic field is generated, and an induced current is generated in the crucible 10. As the result, the crucible 10 itself generates heat and is induction heated.

As described above, the crystal growth apparatus 100 according the present embodiment enables to change the center position of heating of the crucible 10 without changing the position of the crucible 10.

The center position of heating of the crucible 10 may be changed by moving the crucible 10 to the vertical direction without changing the position of the heating member 30. However, when the crucible 10 is transferred to the vertical direction, all positions of the raw material G, the crystal installation part 12, the seed crystal provided at the crystal installation part 12, and the single crystal C are changed together. When the entire positions are changed together, the heating position of the raw material G cannot be changed without changing the growth shape of the single crystal C. The reason is that the growth shape of the single crystal C is formed according to an isothermal line in the crucible 10.

In the crucible 10, another members may be provided such as a tapered member which is used to increase the diameter of a single crystal C and grow the crystal and a shielding member which prevents radiation from a raw material to a growth surface to generate a temperature difference between the raw material and the growth surface. When the entire crucible 10 transfers to the vertical direction, the positional relationship between these members and the heating member 30 is also changed. When the positional relationship between the members and the heating member 30 is changed, the temperature of the members are changed and this may cause the generation of deposits.

On the other hand, in the crystal growth apparatus 100 according the present embodiment, the center position of heating of the crucible 10 is changed by controlling the opening ratio of the opening 23 of the heat-insulating material 20, without changing the position of the crucible 10 and the heating member 30. That is, the heating position of the raw material G can be changed to effectively accelerate the generation of a sublimated gas, while maintaining the temperature of a surface of the single crystal C, that is, while maintaining the shape of a growing crystal. Furthermore, the positional relationship between the heating member 30 and the shielding member and the like is not changed.

Although the preferred embodiment of the present invention has been described in detail above, the present invention is not limited to the certain embodiment, and various modifications and changes are possible within the scope of the present invention described in the claims.

Figure 2:
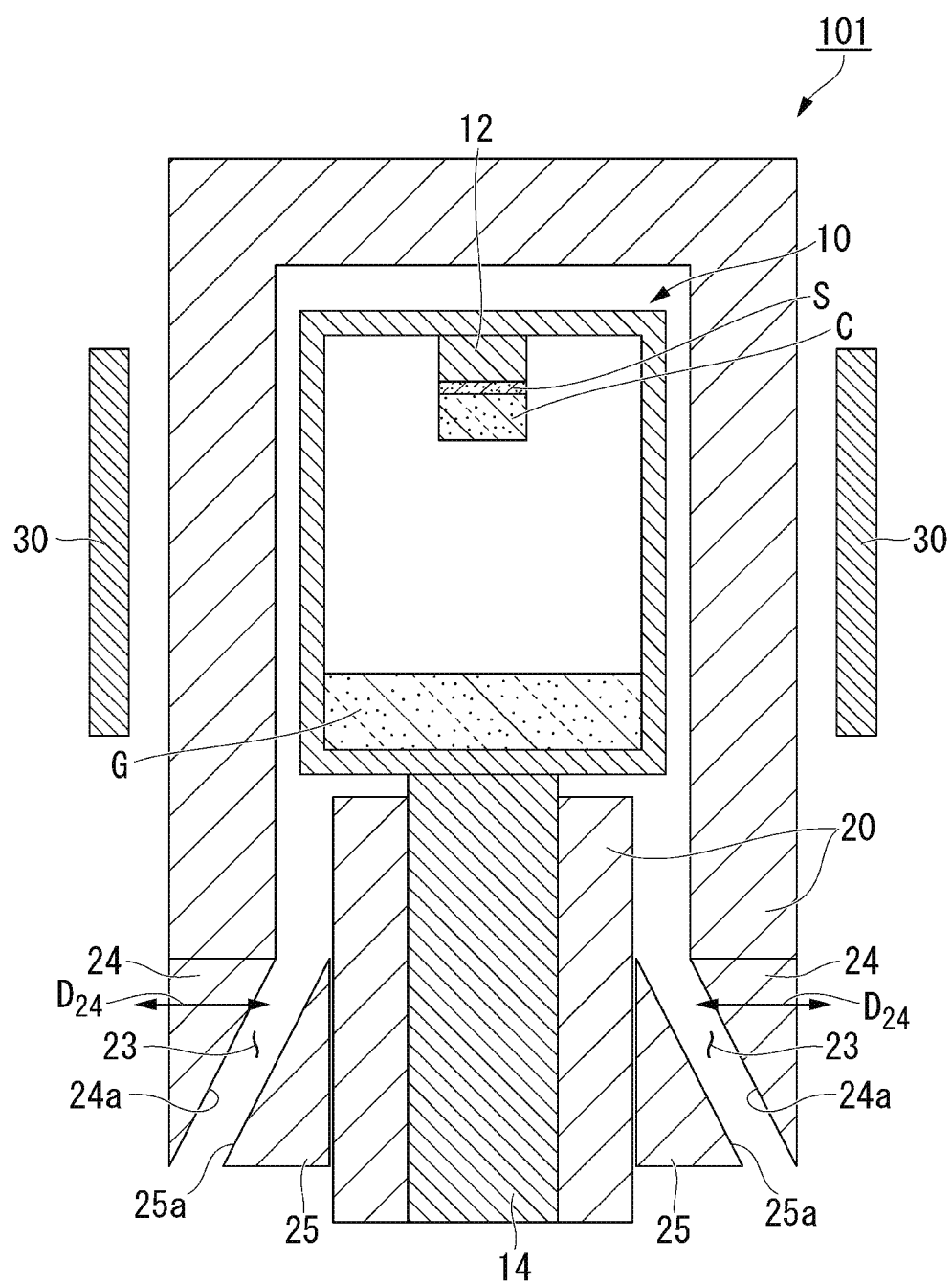
FIG. 2 is a schematic cross-sectional view showing another example of a crystal growth apparatus according to the first embodiment.

FIG. 2 is a schematic view of still another example of the crystal growth apparatus according to the first embodiment. In the crystal growth apparatus 101 shown in FIG. 2, the positional relationship of a movable part 24 and an opposed part 25 are inverted as compared with that of the movable part 22 and the opposed part 21 of the crystal growth apparatus 100 shown in FIG. 1.

The movable part 24 is a part of the heat-insulating material 20, and a movable element. The operating direction $D_{24}$ of the movable part 24 shown in FIG. 2 is a radial direction. The movable part 24 is formed in an annular shape, and an inner diameter thereof increases from an upper end to a lower end. That is, the cross sectional width of the movable part 24 decreases from the upper end to the lower end of the part. The lower surface of the movable part 24 is an inclined surface 24a which is inclined to the operating direction $D_{24}$.

The opposed part 25 of the heat-insulating material 20, which faces the movable part 24, is a member which has an annular shape and surrounds the support member 14, and an outer diameter of the opposed part increases from an upper end to a lower end. The upper surface of the opposed part 25 is a second inclined surface 25a which is inclined to the operating direction $D_{24}$. The second inclined surface 25a faces the inclined surface 24a, and is inclined to the operating direction $D_{24}$ to be the same inclination angle as that of the inclined surface 24a.

When the movable part 24 transfers in the radial direction, an opening ratio of an opening 23 between the inclined surface 24a and the second inclined surface 25a is changed. By controlling the opening ratio of the opening 23, the center position of heating in the vertical direction of the crucible 10 can be controlled. When the operating direction $D_{24}$ of the movable part 24 is a radial direction, the inner diameter of the movable part 24 is changed according to the position of the movable part 24, control of the opening ratio becomes difficult. However, by forming the opening 23, the center position of heating in the vertical direction of the crucible 10 can be controlled. The heat-insulating material which forms the movable part 24 may expand, contract or deform, when the movable part 24 has an annular shape and enlarges or shrinks toward the outer side or the inner side in the radial direction. The aforementioned movement is possible, when the movable part 24 is formed by a material having flexibility such as a felt material.

Figure 3:
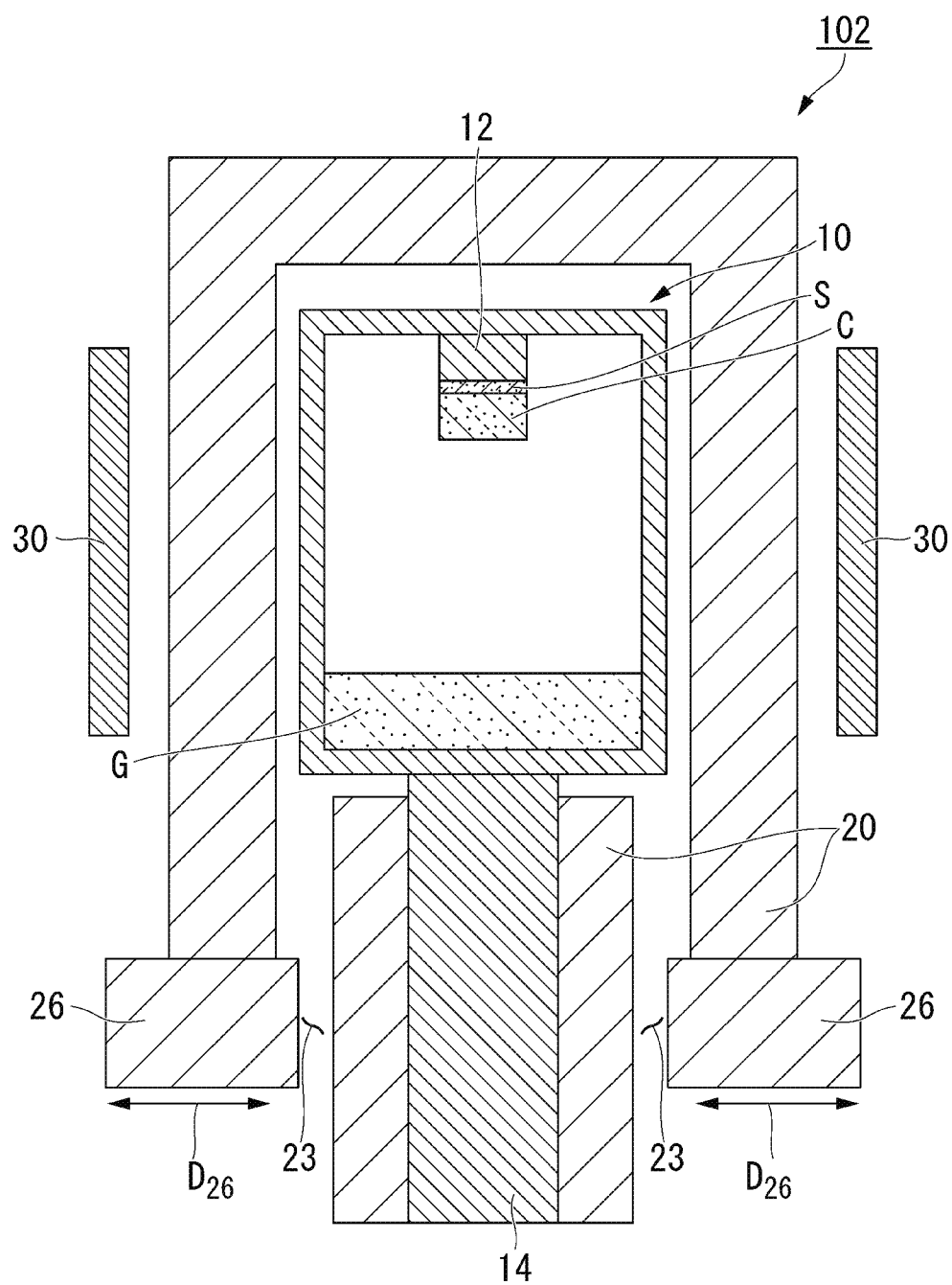
FIG. 3 is a schematic cross-sectional view showing another example of a crystal growth apparatus according to the first embodiment.

FIG. 3 is a schematic view of still another example of the crystal growth apparatus according to the first embodiment. A crystal growth apparatus 102 shown in FIG. 3 is different from the crystal growth apparatus 101 shown in FIG. 2 in that a movable part 26 does not have an inclined surface. The operating direction $D_{26}$ of the movable part 26 is a radial direction. The movable part 26 has a first surface which is vertical to the operating direction, and the heat-insulating material 20 has a second surface which faces the movable part. An opening ratio can be controlled by a distance between the first surface and the second surface which faces the movable part of the heat-insulating material. The movable part 26 has an annular shape in plan view. The heat-insulating material which forms the movable part 26 may expand, contract or deform, when the movable part 26 has an annular shape and moves. The aforementioned movement is possible, when the movable part is formed by a material having flexibility such as a felt material.

When the movable part 26 does not have an inclined surface, a heat transfer path formed by an opening 23 becomes short. Accordingly, due to a slight change of the opening ratio of the opening 23, the center position of heating can be changed greatly. If control with high accuracy is required, it is preferable for the movable part 26 to have an inclined surface as shown in FIGS. 1 and 2. However, if the length of the crucible 10 in the vertical direction is long and it is necessary to greatly change the center position of heating, the aforementioned structure can be suitably used.

The opening 23 is provided below the crucible 10 in the crystal growth apparatus 100, 101 and 102 shown in FIG. 1 to FIG. 3. However, the opening 23 is not necessary provided below the crucible 10. The structure may be possible wherein the opening 23 is provided above the crucible 10 so that the center position of heating transfers downward.

EXAMPLES

Example 1

Figure 4:
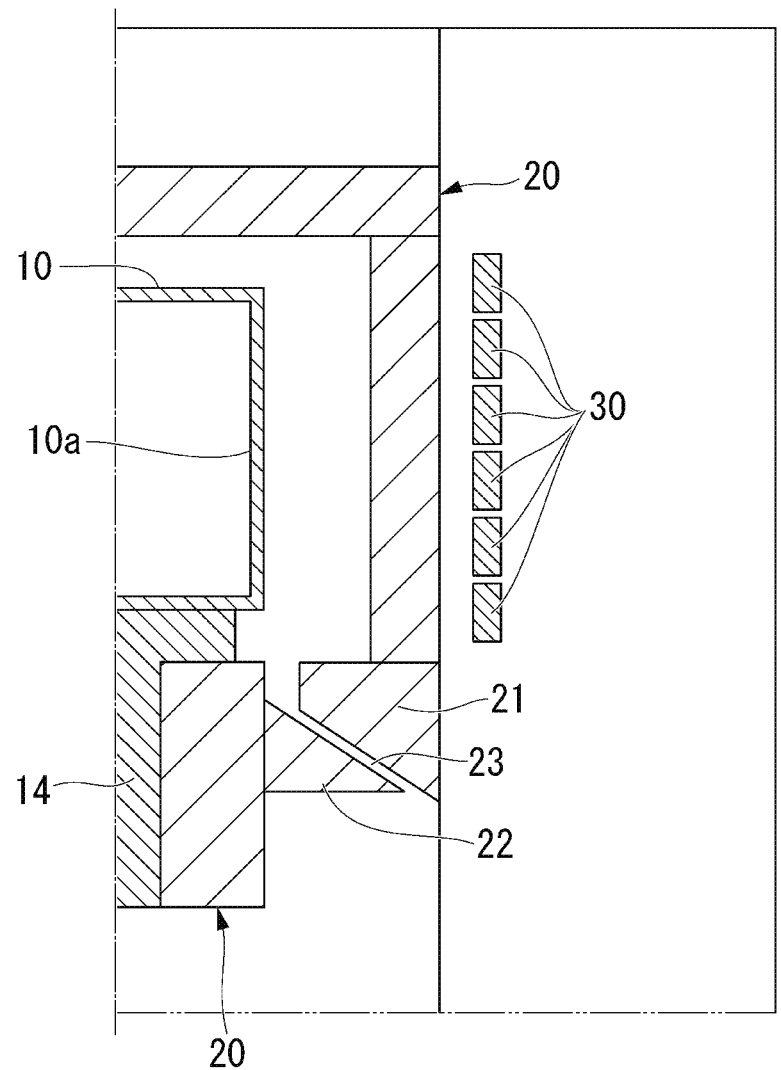
FIG. 4 is a view showing a device configuration of a crystal growth apparatus used for the simulation of Examples 1 to 4.

FIG. 4 shows an apparatus configuration of a crystal growing apparatus, which was used for simulation of Example 1. The crystal growing apparatus has a structure which is formed symmetrical to a center axis, which is used as a center, of a support member 14 and a crucible 10. A movable part 22 can move in a vertical direction, and an opening 23 is formed due to the operation of the movable part 22 in a vertical direction.

In order to reduce calculation load, a simulation was performed only for a structure of an optional half cross section of the apparatus (half in the radial direction), which passes through the center axis of the device. For simulation, crystal growth analysis software "Virtual Reactor" which is commercially available from STR-Group Ltd was used. This simulation software is widely used for simulation of the temperature distribution in a furnace, and is confirmed to have high correlation with the actual experimental result.

In Example 1, the simulation was performed with respect to the structure wherein the movable part 22 closely contacts with the opposed part 21. In the simulation, temperature distribution in the crucible 10 was measured. Then, the maximum temperature of a side wall 10a of the crucible 10 and the position at which the maximum temperature was measured were obtained. The position at which the maximum temperature was measured was obtained as a distance from the upper surface of the inner side of the crucible 10. In Example 1, the maximum temperature of the side wall 10a of the crucible 10 was 2416.2° C., and the maximum temperature was obtained at the position of 133.3 mm from the upper surface of the inner side of the crucible 10. A simulation result of Example 1 was shown in (a) of FIG. 5.

Example 2

Example 2 was different from Example 1 in that the movable part 22 was moved 10 mm to the lower side from the state where the movable part 22 was closely contacted with the opposed part 21 (Example 1). Other conditions were similar to that of Example 1. In Example 2, the maximum temperature of the side wall 10a of the crucible 10 was 2415.3° C., and the maximum temperature was obtained at the position of 112.7 mm from the upper surface of the inner side of the crucible 10. A simulation result of Example 2 was shown in (b) of FIG. 5.

Example 3

Example 3 was different from Example 1 in that the movable part 22 was moved 30 mm to the lower side from the state where the movable part 22 was closely contacted with the opposed part 21 (Example 1). Other conditions were similar to that of Example 1. In Example 3, the maximum temperature of the side wall 10a of the crucible 10 was 2413.7° C., and the maximum temperature was obtained at the position of 70.7 mm from the upper surface of the inner side of the crucible 10. A simulation result of Example 3 was shown in (c) of FIG. 5.

Example 4

Example 4 was different from Example 1 in that the movable part 22 was moved 50 mm to the lower side from the state where the movable part 22 was closely contacted with the opposed part 21 (Example 1). Other conditions were similar to that of Example 1. In Example 4, the maximum temperature of the side wall 10a of the crucible 10 was 2413.5° C., and the maximum temperature was obtained at the position of 60.8 mm from the upper surface of the inner side of the crucible 10. A simulation result of Example 4 was shown in (d) of FIG. 5.

The results of Examples 1 to 4 were shown in Table 1 below. In Table 1, a reference point means a position of the movable part 22 at which the movable part 22 closely contacts with the opposed part 21 (Example 1).

TABLE 1

|  | Example 1 | Example 2 | Example 3 | Example 4 |
|---|---|---|---|---|
| Position of the movable part from the reference point (mm) | 0 | −10 | −30 | −50 |
| Maximum temperature of the side wall (° C.) | 2416.2 | 2415.3 | 2413.7 | 2413.5 |
| Position of the maximum temperature from the upper surface in the crucible (mm) | 133.3 | 112.7 | 70.7 | 60.8 |

Figure 5:
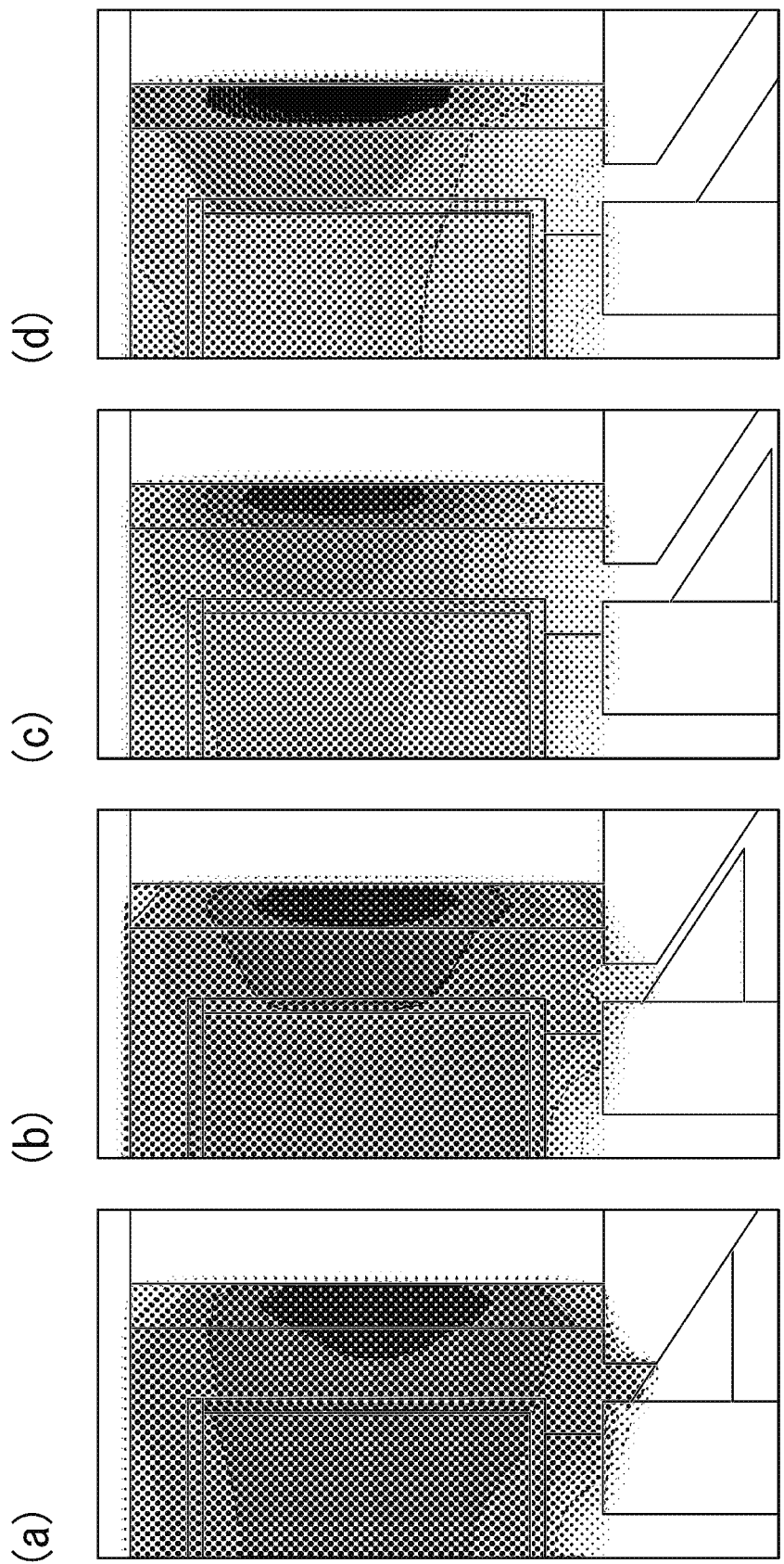
FIG. 5 shows the results of the simulation performed in Examples 1 to 4.

As shown in Table 1 and FIG. 5, as the distance between the movable part 22 and the opposed part 21 increased, that is, as the opening ratio increases, the position at which the maximum temperature of the side wall 10a of the crucible 10 was obtained moved toward the upper side.

As described above, according to the present invention, a crystal growth apparatus which can control the center position of heating can be provided.

EXPLANATION OF REFERENCES

10: Crucible
10a: Side wall
12: Crystal installation part
14: Support member
20: Heat-insulating material
21, 25: Opposed part
21a, 25a: Second inclined surface
22, 24, 26: Movable part
22a, 24a: Inclined surface
23: Opening
30: Heating member
100, 101, 102: Crystal growth apparatus
C: Single crystal
G: Raw material
17
S: Seed crystal
D: Operating direction

The invention claimed is:

1. A crystal growth apparatus, comprising
a crucible,
a heat-insulating material which covers a circumference of the crucible,
a heating member which is located on the outside of the heat-insulating material and is configured to perform induction heating of the crucible, and
a support member which supports the crucible,
wherein
the heat-insulating material has a movable part, wherein the movable part is located below the crucible and has an annular shape in plan view to surround the support member, and the movable part forms an opening in the heat-insulating material by the movement of the movable part to control an opening ratio of the opening of the heat-insulating material, and
the heat-insulating material has an immovable cylindrical part which surrounds the support member and is located between the support member and the movable part.

2. The crystal growth apparatus according to claim 1, wherein the movable part is configured to move symmetrically with the crucible as a center, when the apparatus is observed in planar view from a vertical direction of a supporting surface by which the crucible is supported.

3. The crystal growth apparatus according to claim 1, wherein
the movable part has a first inclined surface which is inclined relative to an operating direction of the movable part, and
the opening ratio is controlled by a distance between the first inclined surface and a second inclined surface which faces the movable part of the heat-insulating material.

4. The crystal growth apparatus according to claim 1, wherein
the movable part is configured to move symmetrically with the crucible as a center, when the apparatus is observed in planar view from a vertical direction of a supporting surface by which the crucible is supported,
the movable part is located below the crucible,
the movable part has a first inclined surface which is inclined relative to an operating direction of the movable part,
the heat-insulating material has a second inclined surface which faces the movable part, and
the opening ratio is controlled by a distance between the first inclined surface and the second inclined surface which faces the movable part of the heat-insulating material.

5. The crystal growth apparatus according to claim 1, wherein
the movable part is configured to move symmetrically with the crucible as a center, when the apparatus is observed in planar view from a vertical direction of a supporting surface by which the crucible is supported,
the movable part is located below the crucible,
the movable part has a first surface which is vertical to an operating direction of the movable part,
the heat-insulating material has a second surface which faces the movable part, and
the opening ratio is controlled by a distance between the first surface and the second surface which faces the movable part of the heat-insulating material.

6. The crystal growth apparatus according to claim 1, wherein
the heat-insulating material has an immovable opposed part which faces the movable part and is located around the movable part.

7. The crystal growth apparatus according to claim 1, wherein the movable part is configured to move in a horizontal direction.

8. The crystal growth apparatus according to claim 1, wherein the movable part is configured to move in a vertical direction.

9. The crystal growth apparatus according to claim 1, wherein the movable part is configured to close and open a space which is surrounded by the heat-insulating material, the crucible, and the support member.

10. The crystal growth apparatus according to claim 1, wherein the movable part has a triangular cross-sectional shape.

11. The crystal growth apparatus according to claim 10, wherein an outer diameter of the movable part increases from an upper end to a lower end thereof, and
an inner diameter of the movable part is unchanged.

12. The crystal growth apparatus according to claim 10, wherein an inner diameter of the movable part increases from an upper end to a lower end and
an outer diameter of the movable part is unchanged.

13. The crystal growth apparatus according to claim 1, wherein the movable part has a quadrilateral cross-sectional shape.

* * * * *